United States Patent
Vasista Srinivasan Ranganathan et al.

(10) Patent No.: US 9,692,451 B2
(45) Date of Patent: Jun. 27, 2017

(54) NON-BINARY LOW DENSITY PARITY CHECK (NB-LDPC) CODES FOR COMMUNICATION SYSTEMS

(71) Applicant: BROADCOM CORPORATION, Irvine, CA (US)

(72) Inventors: Sudarsan Vasista Srinivasan Ranganathan, Los Angeles, CA (US); Ba-Zhong Shen, Irvine, CA (US)

(73) Assignee: Avago Technologies General IP (Singapore) Pte. Ltd, Singapore (SG)

( * ) Notice: Subject to any disclaimer, the term of this patent is extended or adjusted under 35 U.S.C. 154(b) by 15 days.

(21) Appl. No.: 14/850,539

(22) Filed: Sep. 10, 2015

(65) Prior Publication Data
US 2016/0094246 A1    Mar. 31, 2016

Related U.S. Application Data

(60) Provisional application No. 62/057,438, filed on Sep. 30, 2014, provisional application No. 62/214,692, filed on Sep. 4, 2015.

(51) Int. Cl.
*H03M 13/00* (2006.01)
*H03M 13/11* (2006.01)
*H03M 13/03* (2006.01)

(52) U.S. Cl.
CPC ..... *H03M 13/1171* (2013.01); *H03M 13/036* (2013.01); *H03M 13/1117* (2013.01); *H03M 13/1168* (2013.01)

(58) Field of Classification Search
CPC .......... H03M 13/036; H03M 13/1171; H03M 13/1117; H03M 13/1168
See application file for complete search history.

(56) References Cited

U.S. PATENT DOCUMENTS 8,347,168 B2 * 1/2013 Kimura ............... H04L 1/0045
                                                    714/752
8,644,067 B2 * 2/2014 Jeon ..................... G06F 11/1072
                                                    365/185.03
(Continued)

OTHER PUBLICATIONS

European Patent Office; European Search Report; EP Application No. 15002781.1; Feb. 22, 2016; 5 pgs.
(Continued)

*Primary Examiner* — Esaw Abraham
(74) *Attorney, Agent, or Firm* — Garlick & Markison; Shayne X. Short

(57) ABSTRACT

A communication device (alternatively, device) includes a processor configured to support communications with other communication device(s) and to generate and process signals for such communications. In some examples, the device includes a communication interface and a processor, among other possible circuitries, components, elements, etc. to support communications with other communication device(s) and to generate and process signals for such communications. The device receives a non-binary low density parity check (NB-LDPC) coded signal. The device then decodes the NB-LDPC coded signal using a NB-LDPC matrix to generate estimates of information bits encoded therein. The NB-LDPC matrix is characterized by a base proto-matrix having elements that represent sub-matrices, and the elements are selected from a finite Galois field that includes symbols. In another example, the device encodes other information bits using a generator matrix to generate another NB-LDPC coded signal and then transmits this other NB-LDPC coded signal.

20 Claims, 8 Drawing Sheets

(56) References Cited

U.S. PATENT DOCUMENTS

| | | | | |
|---|---|---|---|---|
| 8,656,249 | B2* | 2/2014 | Chen | H03M 13/114 |
| | | | | 714/758 |
| 8,689,083 | B2* | 4/2014 | Nguyen | H03M 13/036 |
| | | | | 714/774 |
| 8,793,551 | B2* | 7/2014 | Zhou | H03M 13/253 |
| | | | | 714/752 |
| 8,924,812 | B2* | 12/2014 | Li | H03M 13/1171 |
| | | | | 714/755 |
| 8,992,594 | B2* | 3/2015 | Soletti | A61B 17/11 |
| | | | | 623/1.13 |
| 9,191,256 | B2* | 11/2015 | Vojcic | H04L 1/005 |
| 2013/0139024 | A1 | 5/2013 | Nguyen et al. | |

OTHER PUBLICATIONS

Dolecek, et al.; Non-Binary Protograph-Based LDPC Codes: Enumerators, Analysis, and Designs; IEEE Transactions on Information Theory; Jul. 1, 2014; pp. 3913-3941; vol. 60, issue 7.

Andrews et al.; Encoders for block-circulant LDPC codes; IEEE International Symposium on Information Theory; ISIT 2005; Sep. 4, 2005; pp. 2300-2304.

Mitchell et al.; Constructing Good QC-LDPC Codes by Pre-lifting Protographs; IEEE 2012 Information Theory Workshop (ITW); Sep. 3-7, 2012; pp. 202-206.

* cited by examiner

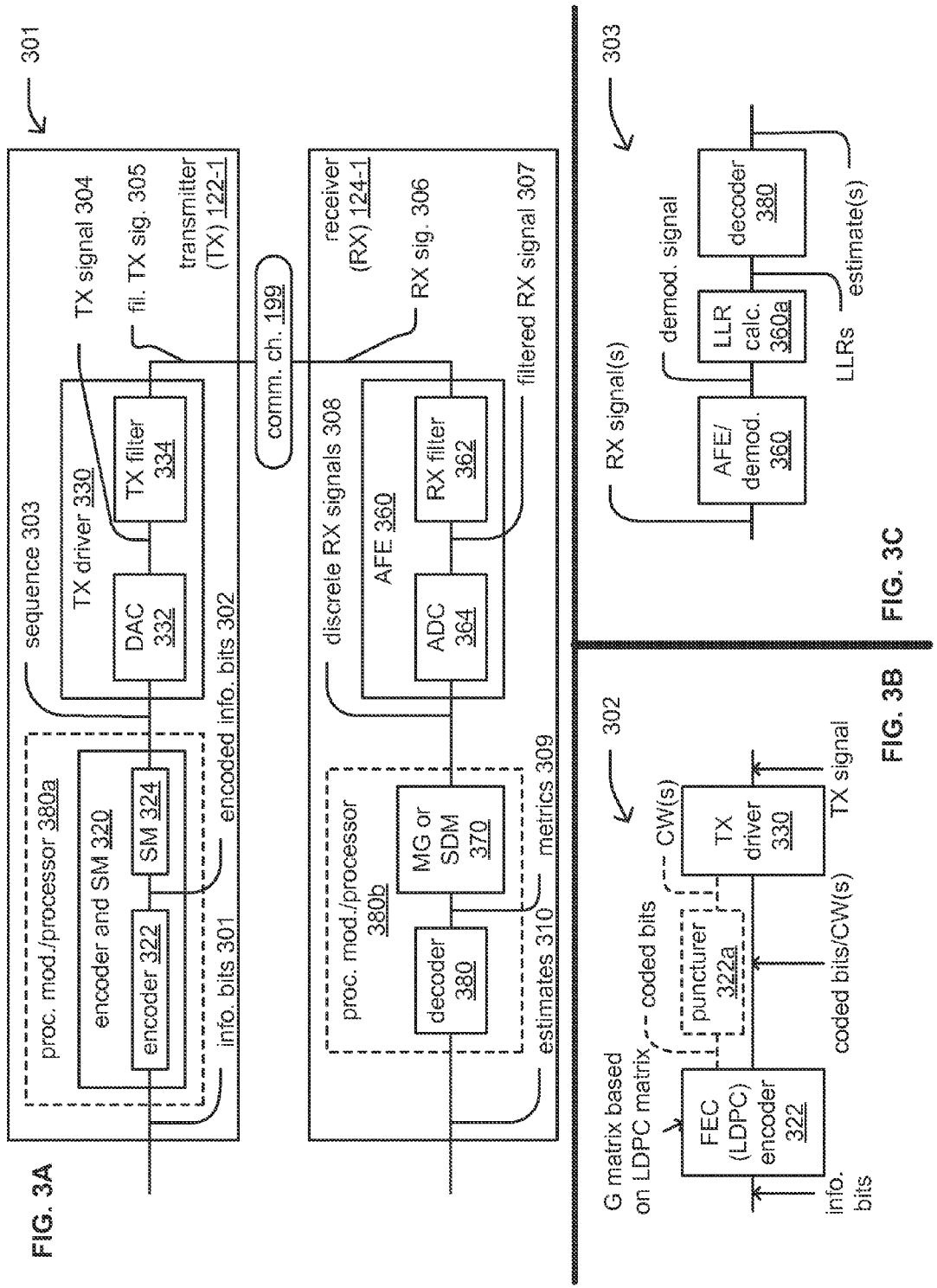

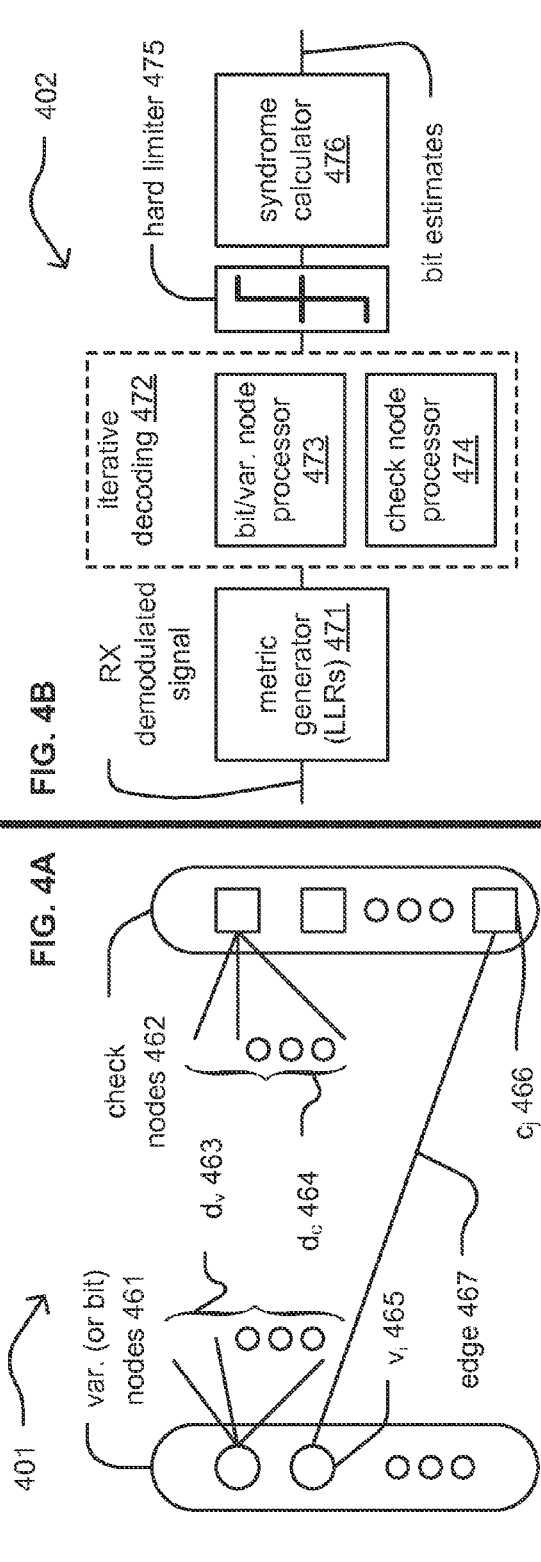
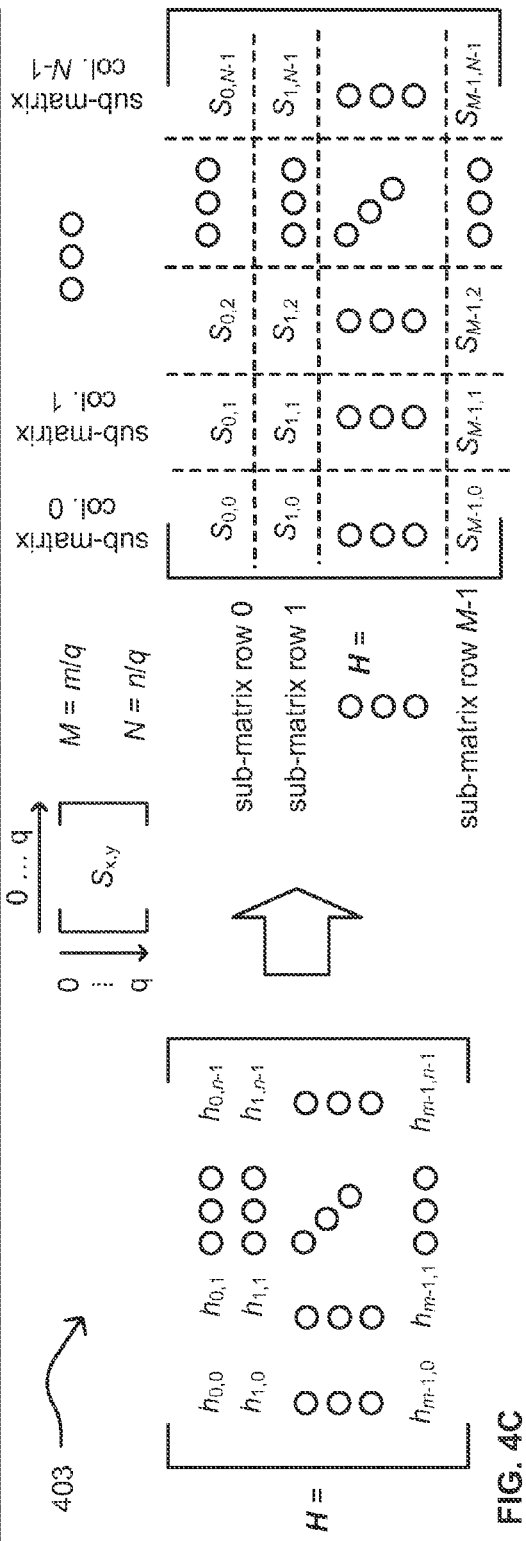

$H_p = \begin{bmatrix} 2 & 2 & 0 \\ 1 & 0 & 2 \end{bmatrix}_{2\times 3}$ 2 or more edges (of a sub-matrix) have common weight

FIG. 6A preliminary base proto-matrix $\begin{bmatrix} 1 & 1 & 0 \\ 1 & 0 & 1 \end{bmatrix}$ → replace 1's with GF(q) symbols → base proto-matrix $\begin{bmatrix} \alpha & \beta & 0 \\ \gamma & 0 & \alpha \end{bmatrix}$

GF(4) = (0, α, β, γ)

FIG. 6B preliminary base proto-matrix $\begin{bmatrix} 1 & 1 & 0 \\ 1 & 0 & 1 \end{bmatrix}$ → replace 1's with GF(q) symbols → base proto-matrix $\begin{bmatrix} 1 & 2 & 0 \\ 3 & 0 & 1 \end{bmatrix}$

GF(4) = (0, 1, 2, 3)

1st-stage lifting (1st lifting factor) →

$\begin{bmatrix} 0 & 0 & 1 & 1 & 0 & 0 & 0 & 0 & 0 \\ 0 & 1 & 0 & 1 & 0 & 1 & 0 & 0 & 0 \\ 1 & 0 & 0 & 1 & 1 & 0 & 0 & 0 & 0 \\ 1 & 1 & 1 & 0 & 0 & 0 & 1 & 0 & 0 \\ 1 & 1 & 1 & 0 & 0 & 0 & 0 & 1 & 0 \\ 1 & 1 & 1 & 0 & 0 & 0 & 0 & 0 & 1 \end{bmatrix}$ sub-matrices 2nd-stage lifting (2nd lifting factor) → NB-LDPC matrix

FIG. 6C

NON-BINARY LOW DENSITY PARITY CHECK (NB-LDPC) CODES FOR COMMUNICATION SYSTEMS

CROSS REFERENCE TO RELATED PATENTS/PATENT APPLICATIONS

Provisional Priority Claims

The present U.S. Utility patent application claims priority pursuant to 35 U.S.C. §119(e) to U.S. Provisional Application No. 62/057,438, entitled "Non-binary LDPC codes for wireless and wired communications," filed Sep. 30, 2014; and U.S. Provisional Application No. 62/214,692, entitled "Non-binary low density parity check (NB-LDPC) codes for communication systems," filed Sep. 4, 2015, both of which are hereby incorporated herein by reference in their entirety and made part of the present U.S. Utility patent application for all purposes.

BACKGROUND

Technical Field

The present disclosure relates generally to communication systems; and, more particularly, to error checking and correction (ECC) code and/or forward error correction (FEC) code encoding and decoding within such communication systems.

Description of Related Art

Data communication systems have been under continual development for many years. The primary goal within such communication systems is to transmit information successfully between devices. Unfortunately, many things can deleteriously affect signals transmitted within such systems resulting in degradation of or even complete failure of communication. Examples of adverse effects include interference and noise that may be caused by various sources including other communications, low-quality links, degraded or corrupted interfaces and connectors, etc.

Some communication systems use forward error correction (FEC) coding and/or error checking and correction (ECC) coding to increase the reliability and the amount of information that may be transmitted between devices. When a signal incurs one or more errors during transmission, a receiver device can employ the FEC or ECC coding to try to correct those one or more errors.

A continual and primary directive in this area of development has been to try continually to lower the signal to noise ratio (SNR) required to achieve a given bit error ratio (BER) or symbol error ratio (SER) within a communication system. The Shannon limit is the theoretical bound for channel capacity for a given modulation and code rate. The ideal goal has been to try to reach Shannon's channel capacity limit in a communication channel. Shannon's limit may be viewed as being the maximum data rate per unit of bandwidth (i.e., spectral efficiency) to be used in a communication channel, having a particular SNR, where transmission through the communication channel with arbitrarily low BER or SER is achievable. Conventional and prior art technologies do not adequately provide for optimum communication system performance and leave much room for improvement.

BRIEF DESCRIPTION OF THE SEVERAL VIEWS OF THE DRAWINGS

FIG. 3A is a diagram illustrating an example of communication devices operative within one or more communication systems.

FIG. 3B is a diagram illustrating another example of a communication device operative within one or more communication systems.

FIG. 3C is a diagram illustrating another example of a communication device operative within one or more communication systems.

FIG. 4A illustrates an example of an LDPC (Low Density Parity Check) code bipartite graph.

FIG. 4B illustrates an example of decoding of an LDPC coded signal.

FIG. 4C illustrates an example of an LDPC matrix that is partitioned into sub-matrices.

FIG. 6A is a diagram illustrating an example of a proto-graph and a corresponding matrix having multiple edges between at least one variable node and at least one check node.

FIG. 6B is a diagram illustrating an example of generation of a base proto-matrix.

FIG. 6C is a diagram illustrating another example of generation of a NB-LDPC matrix.

DETAILED DESCRIPTION

Figure 1A:
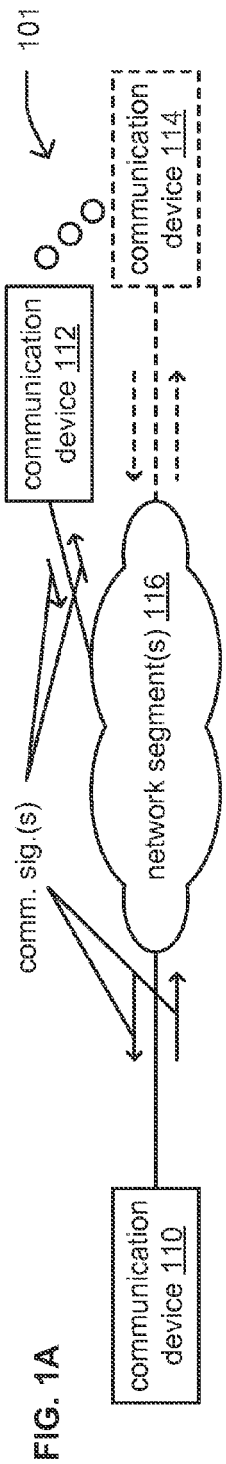
FIG. 1A is a diagram illustrating an embodiment of one or more communication systems.

FIG. 1A is a diagram illustrating an embodiment 101 of one or more communication systems. One or more network segments 116 provide communication inter-connectivity for at least two communication devices 110 and 112 (also referred to as communication devices in certain locations in the diagrams). Note that general reference to a communication device may be made generally herein using the term 'device' (e.g., device 110 or CD 110 when referring to communication device 110, or devices 110 and 112, or CDs 110 and 112, when referring to communication devices 110 and 112; note that CD is used in certain diagrams for brevity). Generally speaking, any desired number of communication devices are included within one or more communication systems (e.g., as shown by communication device 114).

The various communication links within the one or more network segments 116 may be implemented using any of a variety of communication media including communication links implemented as wireless, wired, optical, satellite, microwave, and/or any combination thereof, etc. communication links. Also, in some instances, communication links of different types may cooperatively form a connection pathway between any two communication devices. Considering one possible example, a communication pathway between devices 110 and 112 may include some segments of wired communication links and other segments of optical communication links. Note also that the devices 110-114 may be of a variety of types of devices including stationary devices, mobile devices, portable devices, etc. and may support communications for any of a number of services or service flows including data, telephony, television, Internet, media, synchronization, etc.

In an example of implementation, device 110 includes a communication interface to support communications with one or more of the other devices 112-114. This communication may be bidirectional/to and from the one or more of the other devices 112-114 or unidirectional (or primarily unidirectional) from the one or more of the other devices 112-114.

In another example of implementation, device 110 includes a communication interface and/or a processor (and possibly other possible circuitries, components, elements, etc.) to support communications with other device(s) and to generate and process signals for such communications. The communication interface and/or the processor operate to perform various operations and functions to effectuate such communications.

In an example of operation, one of the devices, such as device 110, includes a communication interface and/or a processor that operate to support communications with another device, such as device 112, among others within the system. For example, the processor is operative to generate and interpret different signals, frames, packets, symbols, etc. for transmission to other devices and that have been received from other devices.

In an example of operation, device 110 receives a non-binary low density parity check (NB-LDPC) coded signal from device 112. The device 110 then decodes the NB-LDPC coded signal using a NB-LDPC matrix to generate estimates of information bits encoded therein. The NB-LDPC matrix is characterized by a base proto-matrix having elements that represent sub-matrices, and the elements are selected from a finite Galois field that includes 2-bit symbols (e.g., a Galois field that includes 4 elements). In other examples, the elements may be selected from any sized finite Galois field that includes n-bit symbols (e.g., a Galois field that includes $2^n$ n-bit symbols). Consider a finite field (Galois field) GF(q), where $q=p^m$ and p is a prime number and integer m>0. Let α be a primitive element of this field. Then, the Galois field may be defined as follows: GF(q)={0, α, ..., $α^{q-1}$}. In a digital implementation of an communication device operating using finite precision math (e.g., that uses a certain number of bits to represent numbers), then certain calculations may be performed digitally using values that are also represented by groups of bits that correspond to these numbers in accordance with Galois field computations (e.g., these groups of bits can be referred to as symbols).

The NB-LDPC matrix may be characterized by a bipartite graph that includes check node and variable nodes, and edges specify connectivity between the check nodes and the variable nodes. In one examples of implementation, each edge of a subset of the edges that corresponds to a given sub-matrix of the sub-matrices that is based on a non-zero-valued 2-bit symbol has a common weight.

In another example of operation, device 110 encodes other information bits using a generator matrix to generate another NB-LDPC coded signal. The device 110 then transmits this other NB-LDPC coded signal to device 112 and/or 114. The generator matrix corresponds to the NB-LDPC matrix. Note that the device 110 may be configured to perform decoding and/or encoding of different NB-LDPC coded signals based on different NB-LDPC matrices and corresponding generator matrices at or during different times. For example, the device 110 may be configured to support communications based on different NB-LDPC coded signals such as in accordance with various communication standards, communication protocols, and/or recommended standards.

Figure 1B:
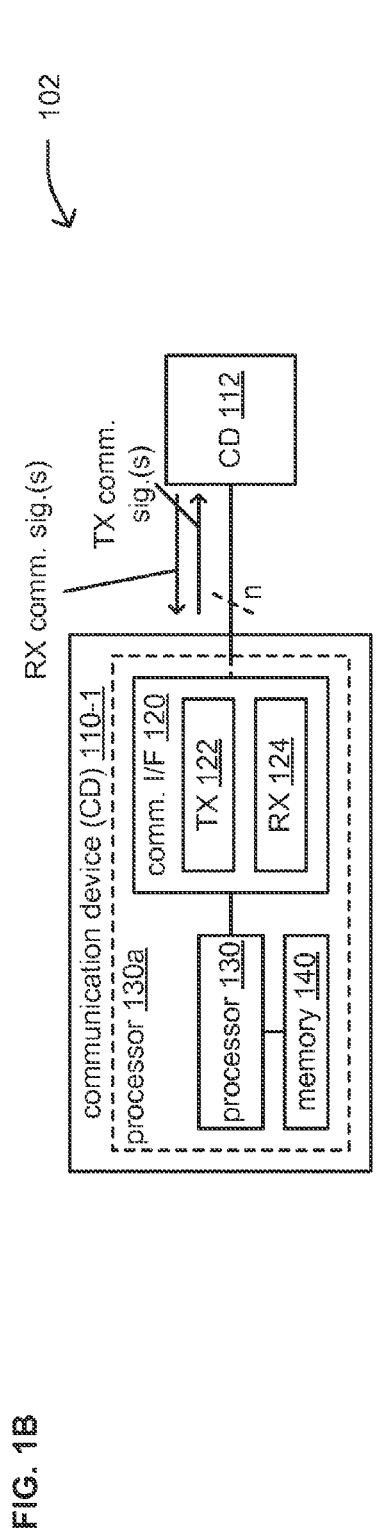
FIG. 1B is a diagram illustrating an example of a communication device operative within one or more communication systems.

FIG. 1B is a diagram illustrating an example 102 of a communication device 110-1 operative within one or more communication systems. The device 110-1 includes a communication interface 120 and a processor 130. The communication interface 120 includes functionality of a transmitter 122 and a receiver 124 to support communications with one or more other devices within a communication system. The device 110-1 may also include memory 140 to store information including one or more signals generated by the device 110-1 or such information received from other devices (e.g., device 112) via one or more communication channels. Memory 140 may also include and store various operational instructions for use by the processor 130 in regards to the processing of messages and/or other received signals and generation of other messages and/or other signals including those described herein. Memory 140 may also store information including one or more types of encoding, one or more types of symbol mapping, concatenation of various modulation coding schemes, etc. as may be generated by the device 110-1 or such information received from other devices via one or more communication channels. The communication interface 120 supports communications to and from one or more other devices (e.g., CD 112 and/or other communication devices). Operation of the communication interface 120 may be directed by the processor 130 such that processor 130 transmits and receives signals (TX(s) and RX(s)) via the communication interface 120.

Generally speaking, the communication interface 120 is implemented to perform any such operations of an analog front end (AFE) and/or physical layer (PHY) transmitter, receiver, and/or transceiver. Examples of such operations may include any one or more of various operations including conversions between the frequency and analog or continuous time domains (e.g., such as the operations performed by a digital to analog converter (DAC) and/or an analog to digital converter (ADC)), gain adjustment including scaling, filtering (e.g., in either the digital or analog domains), frequency conversion (e.g., such as frequency upscaling and or frequency downscaling, such as to a baseband frequency at which one or more of the components of the device 110-1 operates), equalization, pre-equalization, metric generation, symbol mapping and/or de-mapping, automatic gain control (AGC) operations, and/or any other operations that may be performed by an AFE and/or PHY component within a communication device.

Note that device 110 may be implemented to operate as any one or more of a satellite communication device, a wireless communication device, a wired communication device, a fiber-optic communication device, or a mobile communication device and implemented and/or operative within any one or more communication systems including a satellite communication system, a wireless communication system, a wired communication system, a fiber-optic communication system, or a mobile communication system.

Also, in some examples, note that one or more of the processor 130, the communication interface 120 (including the TX 122 and/or RX 124 thereof), and/or the memory 140 may be implemented in one or more "processing modules," "processing circuits," "processors," and/or "processing units". Considering one example, one processor 130*a* may be implemented to include the processor 130, the communication interface 120 (including the TX 122 and/or RX 124 thereof), and the memory 140. Considering another example, two or more processors may be implemented to include the processor 130, the communication interface 120 (including the TX 122 and/or RX 124 thereof), and the memory 140. In such examples, such a "processor" or "processors" is/are configured to perform various operations, functions, communications, etc. as described herein. In general, the various elements, components, etc. shown within the device 110 may be implemented in any number of "processing modules," "processing circuits," "processors," and/or "processing units" (e.g., 1, 2, . . . , and generally using N such "processing modules," "processing circuits," "processors," and/or "processing units", where N is a positive integer greater than or equal to 1).

Figure 1C:
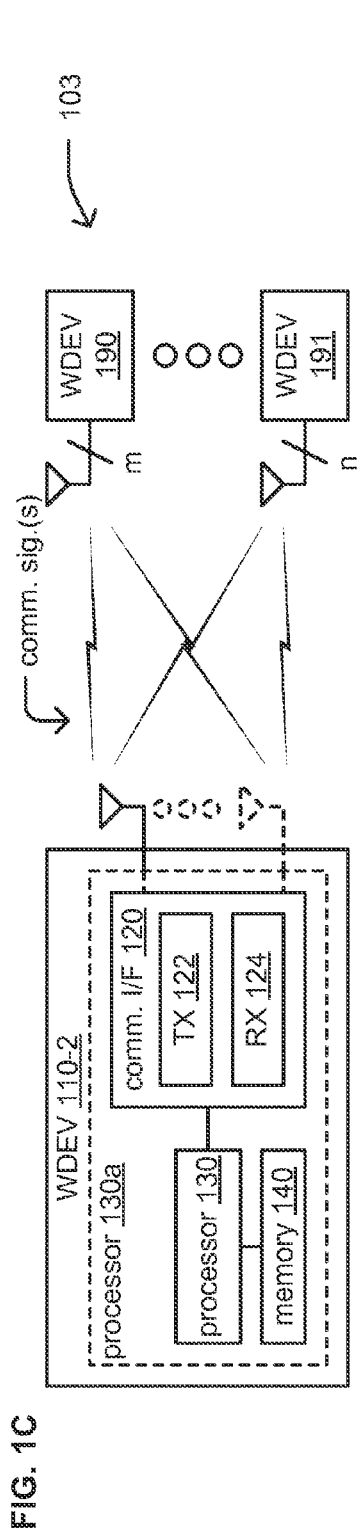
FIG. 1C is a diagram illustrating another example of a communication device operative within one or more communication systems.

FIG. 1C is a diagram illustrating another example 103 of a communication device 110-2 operative within one or more communication systems. A wireless communication device 110 (e.g., which may be any one of devices 118-132 as with reference to FIG. 2) is in communication with another wireless communication device 190 via a transmission medium. The wireless communication device 110 includes a communication interface 120 to perform transmitting and receiving of at least one signal, symbol, packet, frame, etc. (e.g., using a transmitter 122 and a receiver 124) (note that general reference to packet or frame may be used interchangeably).

Generally speaking, the communication interface 120 is implemented to perform any such operations of an analog front end (AFE) and/or physical layer (PHY) transmitter, receiver, and/or transceiver. Examples of such operations may include any one or more of various operations including conversions between the frequency and analog or continuous time domains (e.g., such as the operations performed by a digital to analog converter (DAC) and/or an analog to digital converter (ADC)), gain adjustment including scaling, filtering (e.g., in either the digital or analog domains), frequency conversion (e.g., such as frequency upscaling and/or frequency downscaling, such as to a baseband frequency at which one or more of the components of the device 110 operates), equalization, pre-equalization, metric generation, symbol mapping and/or de-mapping, automatic gain control (AGC) operations, and/or any other operations that may be performed by an AFE and/or PHY component within a wireless communication device.

In some implementations, the wireless communication device 110 also includes a processor 130, and an associated memory 140, to execute various operations including interpreting at least one signal, symbol, packet, and/or frame transmitted to wireless communication device 190 and/or received from the wireless communication device 190 and/or wireless communication device 191. The wireless communication devices 110 and 190 (and/or 191) may be implemented using at least one integrated circuit in accordance with any desired configuration or combination of components, modules, etc. within at least one integrated circuit. Also, the wireless communication devices 110, 190, and/or 191 may each include one or more antennas for transmitting and/or receiving of at least one packet or frame (e.g., WDEV 190 may include m antennae, and WDEV 191 may include n antennae).

Also, in some examples, note that one or more of the processor 130, the communication interface 120 (including the TX 122 and/or RX 124 thereof), and/or the memory 140 may be implemented in one or more "processing modules," "processing circuits," "processors," and/or "processing units". Considering one example, one processor 130*a* may be implemented to include the processor 130, the communication interface 120 (including the TX 122 and/or RX 124 thereof), and the memory 140. Considering another example, two or more processors may be implemented to include the processor 130, the communication interface 120 (including the TX 122 and/or RX 124 thereof), and the memory 140. In such examples, such a "processor" or "processors" is/are configured to perform various operations, functions, communications, etc. as described herein. In general, the various elements, components, etc. shown within the device 110 may be implemented in any number of "processing modules," "processing circuits," "processors," and/or "processing units" (e.g., 1, 2, . . . , and generally using N such "processing modules," "processing circuits," "processors," and/or "processing units", where N is a positive integer greater than or equal to 1).

Note that the devices 110-1 and 110-2 may include same, similar, or different components. The devices 110-1 include components configured to support communications based on a wired, optical, etc. type of communication medium whereas the and 110-2 include components configured to support communications based on a wireless, satellite, microwave, etc. type of communication medium.

In some examples, the device 110 includes both processor 130 and communication interface 120 configured to perform various operations. In other examples, the device 110 includes processor 130*a* configured to perform various operations.

In an example of operation, processor 130 and/or communication interface 120 (or, alternatively, processor 130*a*) of device 110-1 (or of device 110-2) receives a NB-LDPC coded signal from device 112 (or device 190). The processor 130 and/or communication interface 120 (or, alternatively, processor 130*a*) then decodes the NB-LDPC coded signal using a NB-LDPC matrix to generate estimates of information bits encoded therein. The NB-LDPC matrix is characterized by a base proto-matrix having elements that represent sub-matrices, and the elements are selected from a finite Galois field that includes 2-bit symbols (e.g., a Galois field that includes 4 elements). The NB-LDPC matrix may be characterized by a bipartite graph that includes check node and variable nodes, and edges specify connectivity between the check nodes and the variable nodes. In one examples of implementation, each edge of a subset of the edges that corresponds to a given sub-matrix of the sub-matrices that is based on a non-zero-valued 2-bit symbol has a common weight.

In another example of operation, processor 130 and/or communication interface 120 (or, alternatively, processor 130*a*) encodes other information bits using a generator matrix to generate another NB-LDPC coded signal. The generator matrix corresponds to the NB-LDPC matrix. Note that the processor 130 and/or communication interface 120 (or, alternatively, processor 130*a*) may be configured to perform decoding and/or encoding of different NB-LDPC coded signals based on different NB-LDPC matrices and corresponding generator matrices at or during different times. For example, the processor 130 and/or communication interface 120 (or, alternatively, processor 130*a*) may be configured to support communications based on different NB-LDPC coded signals such as in accordance with various communication standards, communication protocols, and/or recommended standards.

In some examples, a zero-valued 2-bit symbol within the base proto-matrix represents an all-zero-valued sub-matrix within the plurality of sub-matrices, a first zero-valued 2-bit symbol within the base proto-matrix represents a first sub-matrix of the sub-matrices that is a circulant permutation sub-matrix (e.g., an identity sub-matrix, a CSI (Cyclic Shifted Identity) sub-matrix, etc.), a second zero-valued 2-bit symbol within the base proto-matrix represents a second sub-matrix of the plurality of sub-matrices that is a first sum of two circulant permutation sub-matrices, and a third zero-valued 2-bit symbol within the base proto-matrix represents a third sub-matrix of the plurality of sub-matrices that is a second sum of three circulant permutation sub-matrices.

In some examples, the NB-LDPC matrix may be characterized by a bipartite graph that includes check node and variable nodes, and edges specify connectivity between the check nodes and the variable nodes. In one examples of implementation, each edge of a first subset of the edges that corresponds to a first sub-matrix of the sub-matrices that is based on a first non-zero-valued 2-bit symbol has a first common weight, and each edge of a second subset of the edges corresponds to a second sub-matrix of the sub-matrices that is based on a second non-zero-valued 2-bit symbol has a second common weight that is different than the first common weight. In some examples of implementation, all the weights associated with edges that correspond to a given sub-matrix have a same or common weight.

In another example of operation, processor 130 and/or communication interface 120 (or, alternatively, processor 130*a*) performs a first stage lifting of the base proto-matrix to generate the sub-matrices and then performs a second stage lifting of the sub-matrices to generate NB-LDPC matrix.

In another example of operation, processor 130 and/or communication interface 120 (or, alternatively, processor 130*a*) performs a first stage lifting of the base proto-matrix using a first lifting factor to generate the sub-matrices and then performs a second stage lifting of the sub-matrices using a second lifting factor that is different than the first lifting factor to generate the NB-LDPC matrix. A total lifting factor from the base proto-matrix to the NB-LDPC matrix is a product of the first lifting factor and the second lifting factor (e.g., the first lifting factor times the second lifting factor).

In another example of operation, the processor 130 and/or communication interface 120 (or, alternatively, processor 130*a*) generates a preliminary base proto-matrix having elements selected from another finite Galois field that includes 1-bit symbols (e.g., a Galois field that include two elements such as 0 and 1) and then replaces non-zero-valued elements (e.g., the is of the preliminary base proto-matrix) of the other elements within the preliminary base proto-matrix with elements that are selected from another finite Galois field that includes 2-bit symbols (e.g., a Galois field that include 4 elements such as 0, 1, 2, 3) to generate the base proto-matrix.

In other examples, the processor 130 and/or communication interface 120 (or, alternatively, processor 130*a*) generates a preliminary base proto-matrix having elements selected from another finite Galois field that includes 1-bit symbols (e.g., a Galois field that include two elements such as 0 and 1) and then replaces non-zero-valued elements (e.g., the 1s of the preliminary base proto-matrix) of the other elements within the preliminary base proto-matrix with elements that are selected from another finite Galois field (e.g., a Galois field that include 4 elements such as 0, $\alpha$, $\beta$, and $\gamma$) to generate the base proto-matrix. In some other examples, elements may be selected from a Galois field of any desired size with symbols therein of any corresponding desired number of bits.

Figure 2:
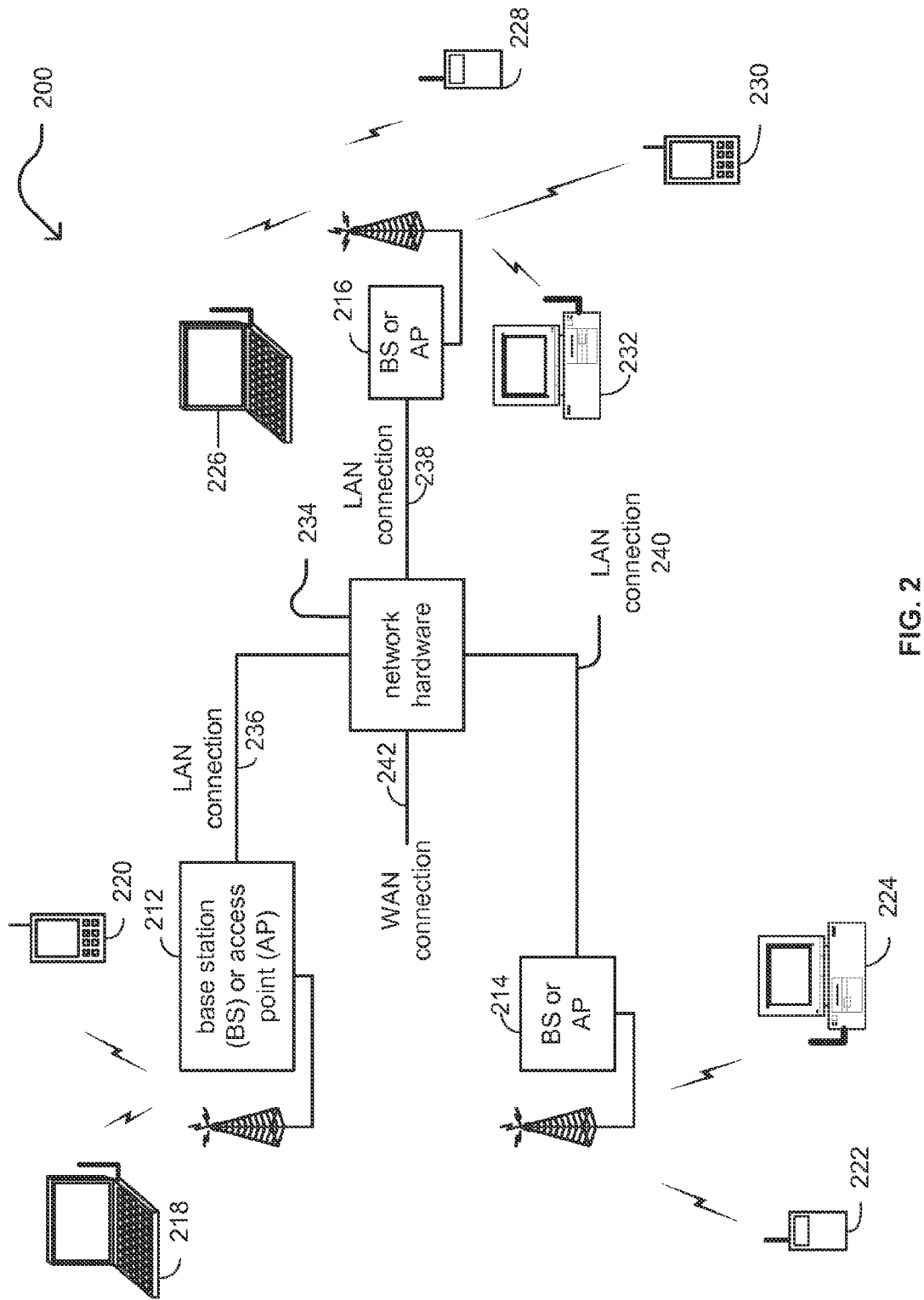
FIG. 2 is a diagram illustrating an embodiment of a wireless communication system.

FIG. 2 is a diagram illustrating an embodiment of a wireless communication system 200. The wireless communication system 200 includes base stations and/or access points 212-216, wireless communication devices 218-232 (e.g., wireless stations (STAs)), and a network hardware component 234. The base stations and/or access points 212-216 are in communication with the network hardware component 234 via local area network (LAN) connections 236, 238, and 240. The network hardware component 234 is also in communication one or more other communication devices via a wide area network (WAN) connection 242. The wireless communication devices 218-232 may be laptop computers, or tablets, 218 and 226, personal digital assistants 220 and 230, personal computers 224 and 232 and/or cellular telephones 222 and 228. Other examples of such wireless communication devices 218-232 could also or alternatively include other types of devices that include wireless communication capability.

Some examples of possible devices that may be implemented to operate in accordance with any of the various examples, embodiments, options, and/or their equivalents, etc. described herein may include, but are not limited by, appliances within homes, businesses, etc. such as refrigerators, microwaves, heaters, heating systems, air conditioners, air conditioning systems, lighting control systems, and/or any other types of appliances, etc.; meters such as for natural gas service, electrical service, water service, Internet service, cable and/or satellite television service, and/or any other types of metering purposes, etc.; devices wearable on a user or person including watches, monitors such as those that monitor activity level, bodily functions such as heartbeat, breathing, bodily activity, bodily motion or lack thereof, etc.; medical devices including intravenous (IV) medicine delivery monitoring and/or controlling devices, blood monitoring devices (e.g., glucose monitoring devices) and/or any other types of medical devices, etc.; premises monitoring devices such as movement detection/monitoring devices, door closed/ajar detection/monitoring devices, security/alarm system monitoring devices, and/or any other type of premises monitoring devices; multimedia devices including televisions, computers, audio playback devices, video playback devices, and/or any other type of multimedia devices, etc.; and/or generally any other type(s) of device(s) that include(s) wireless communication capability, functionality, circuitry, etc. In general, any device that is implemented to support wireless communications may be implemented to operate in accordance with any of the various examples, embodiments, options, and/or their equivalents, etc. described herein. The details of an embodiment of such wireless communication devices are described in greater detail with reference to FIG. 1C among other diagrams. In general, any of the devices in this diagram (e.g., BSs and/or APs 212-216, wireless communication devices 218-232) may be configured to support communications based on one or more non-binary low density parity check (NB-LDPC) codes as described herein.

FIG. 3A is a diagram illustrating an example 301 of communication devices operative within one or more communication systems. In this example, the transmitter (TX) 122-1 of one communication device 110 is transmitting a signal via the communication channel 199 to the receiver (RX) 124-1 of another communication device 120. The transmitter (TX) 122-1 includes a processing module/processor 380a (e.g., implemented as one or more processing modules, processors, circuitries, etc.) and a transmit driver 330. The processing module/processor 380a is configured to include an encoder 322 (e.g., operative to perform low density parity check (LDPC) coding, and/or any other desired error checking and correction (ECC) code or forward error correction (FEC) code such as turbo coding, convolutional coding, turbo trellis coded modulation (TTCM) coding, Reed-Solomon (RS) coding, BCH (Bose and Ray-Chaudhuri, and Hocquenghem) coding, etc. and/or uncoded modulation) and a symbol mapper (SM) 324 or configured to include a combined encoder and symbol mapper 320.

The separately implemented encoder 322 and SM 324 may also perform processing based on concatenated codes. Such concatenated codes may be viewed as performing more than one forward error correction (FEC) code, error checking and correction (ECC) code, etc. in any such desired concatenation scheme. For example, one FEC code, ECC code, etc. may be implemented as an inner code with one or more other FEC codes, ECC codes, etc. implemented as outer code(s), or vice versa. Any desired number of concatenated code stages (e.g., 2, 3, or any higher number) may be implemented in certain embodiments.

The transmit driver 330 includes a digital to analog converter (DAC) 332 and a transmit filter 334. The receiver (RX) 124-1 includes a processing module/processor 380b (e.g., implemented as one or more processing modules, processors, circuitries, etc.) and an analog front end (AFE) 360. The processing module/processor 380b is configured to include a decoder 380 and a metric generator or symbol de-mapper 370. The AFE 360 includes a receive filter 362 that generates a filtered RX signal 307 and an analog to digital converter (DAC) 364.

In an example of operation, the encoder 322 of the transmitter (TX) 122-1 receives information bits 301 of data (e.g., video data, audio data, text, graphics, voice data, etc.). The encoder 322 encodes (in accordance with one or more ECC coding functions, FEC encoding functions, or other encoding functions) a number of the information bits into a plurality of encoded bits 302. For example, the encoder 322 breaks the data into n-bit data blocks and encodes each n-bit data block separately to produce the plurality of encoded bits (e.g., an encoded data block), which includes more bits than the data block (e.g., n+1 or more bits). As such, the encoder is outputting a sequence of encoded bits; one sequence for each data block.

The symbol mapper 324 maps the encoded bits (of one encoded data block) to a constellation point of a constellation map. The symbol mapper 324 outputs a sequence of symbols 303 (e.g., constellation points corresponding to mapped encoded data blocks) to the transmit driver 330.

The DAC 332 converts the sequence of symbols into a continuous-time transmit signal 304. The transmit filter 334 (e.g., channel filter, bandpass filter, notch filter, low pass filter, high pass filter, etc.) filters the signal 304 to produce a filtered, continuous-time transmit (TX) signal 305. The transmitter (TX) 122-1 transmits, via the communication channel 199, the filtered TX signal 305 to the receiver 112 of the other communication device 120.

Within the receiver (RX) 124-1, the receive filter 362 (e.g., channel filter, bandpass filter, notch filter, low pass filter, high pass filter, etc.) filters the continuous-time receive signal 306. The ADC 364 converts the continuous-time receive signal 306 into discrete-time receive signals 308. The metric generator or symbol de-mapper 370 calculates metrics 309 (e.g., on either a symbol and/or bit basis, which may be log-likelihood ratios (LLRs) or other types of metrics). For example, metrics 309 may be viewed as estimated constellation points on the constellation map. The decoder 380 (which essential performs the inverse of the encoder) interprets the metrics 309 to create estimates of the information bits 310.

The encoding and symbol mapping as well as the metric generation and decoding within transmitter (TX) 122-1 and receiver (RX) 124-1, respectively, may be performed using any of the various FEC, ECC, etc. described herein. The operations performed within receiver (RX) 124-1, as related to metric generation and decoding, will be performed based on the type of operations performed within transmitter (TX) 122-1, as related to encoding symbol mapping. For example, metric generation and decoding within receiver (RX) 124-1 may be performed based on a type of FEC, ECC, etc. that is employed to perform encoding symbol mapping within transmitter (TX) 122-1.

FIG. 3B is a diagram illustrating another example 302 of a communication device operative within one or more communication systems. A forward error correction (FEC) encoder 322 processes information bits to generate coded bits. In the context of non-binary low density parity check (NB-LDPC) encoding, encoder 322 employs a generator matrix that is based on a given NB-LDPC code that may also be characterized by a corresponding NB-LDPC matrix. The NB-LDPC matrix can have the characteristics and forms such as described with reference to various diagrams, examples, embodiments, etc. described herein.

In some examples, the encoder 322 outputs coded bits or codewords to be provided to the TX driver 330. In some examples, a puncturer 322a (optional) punctures one or more subsets of information bits and one or more subsets of parity bits from the coded bits generated by the FEC encoder 322 to generate one or more codewords. Note that such coded bits or codewords may undergo symbol mapping in the encoder 322 and/or TX driver 330. These subsets of information bits and parity bits may be groups of contiguous bits within the coded bits. For example, a first contiguous subset of information bits (e.g., having a first period) may be punctured, and a contiguous subset of parity bits may be punctured (e.g., having the first or a second period). In other examples, more than one contiguous subset may be punctured from the coded bits (e.g., two or more contiguous subsets of information bits may be punctured, and two or more contiguous subsets of parity bits may be punctured). In even other examples, different numbers of subsets of bits may be punctured from the information bits and the parity bits (e.g., one subset of bits punctured from information bits, and to subsets of bits punctured from the parity bits). Such puncturing may be performed using different periods of bits, and/or different starting locations within the coded bits.

A transmit (TX) driver 330 processes the one or more codewords to generate one or more continuous-time signals for transmission to one or more other devices via one or more communication channels. The TX driver 330 may perform operations such as those of an analog front end (AFE) of a communication device (e.g., digital to analog conversion, frequency conversion such as conversion, scaling, filtering, etc.). Generally, the TX driver 330 operates to generate a signal suitable for transmission from the communication device. In other examples, all of the operations shown in FIG. 3B may be performed by processor 130a of device 110-1 or 110-2.

FIG. 3C is a diagram illustrating another example 303 of a communication device operative within one or more communication systems. An analog front end (AFE)/demodulator 360 receives one or more signals (RX signal(s)) from one or more communication channels and generates one or more demodulated signals based thereon. A log-likelihood ratio (LLR) calculator 360a processes the one or more demodulated signals to generate LLRs, and a decoder 380 decodes the signals using the LLRs to generate estimates of information encoded within the signals. Generally, the AFE/demodulator 360 operates to receive and process a signal received from a communication channel. In other examples, all of the operations shown in FIG. 3C may be performed by processor 130a of device 110-1 or 110-2.

In general, any of the devices in these diagrams may be configured to support communications based on one or more NB-LDPC codes as described herein.

FIG. 4A illustrates an example 401 of an LDPC (Low Density Parity Check) code bipartite graph. An LDPC bipartite graph is sometimes referred to as a "Tanner" graph. An LDPC bipartite graph is a pictorial representation of an LDPC matrix of a corresponding LDPC code, and it shows the relationship of non-null elements of the LDPC matrix that performs bit or variable edge message updating (based on columns of the LDPC matrix) and check message updating (based on rows of the LDPC matrix). An LDPC code is characterized by a binary parity check matrix (i.e., LDPC matrix) that is sparse, such that nearly all of the elements of the matrix have values of zero ("0"). For example, $H=(h_{i,j})_{M \times N}$ is a parity check matrix of an LDPC code with block length N. The LDPC bipartite graph, or "Tanner" graph, is a pictorial illustration of an LDPC matrix.

LDPC codes are linear block codes and hence the set of all codewords $x \in C$ spans the null space of a parity check matrix, H, as follows:

$$Hx^T = 0, \forall x \in C \quad (1)$$

For an LDPC code, the matrix, H, is a sparse binary matrix of dimension m×n. Each row of H corresponds to a parity check and a set element $h_{ij}$ indicates that data symbol j used for the parity check i. Each column of H corresponds to a codeword symbol.

For each codeword x, there are n symbols of which m are parity symbols. Hence the code rate of the LDPC code, r, is provided as follows:

$$r = (n-m)/n \quad (2)$$

The row and column weights are defined as the number of set elements in a given row or column of H, respectively. The set elements of H are chosen to satisfy the performance requirements of the code. The number of 1's in the i-th column of the parity check matrix, H, may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v, d_c)$ regular LDPC code, otherwise the LDPC code is called an irregular LDPC code.

A regular LDPC code can be represented as a bipartite graph by its parity check matrix with left side nodes representing variable of the code bits (or alternatively as the "variable nodes" (or "bit nodes") 461 in a bit-based decoding of LDPC coded signals), and the right side nodes representing check equations (or alternatively as the "check nodes" 462). The bipartite graph (or Tanner graph) of the LDPC code defined by H may be defined by N variable nodes (e.g., N bit nodes) and M check nodes. Every variable node of the N variable nodes 461 has exactly $d_v(i)$ edges. As an example, edge 467 connects the bit node, $v_i$ 465, to one or more of the check nodes (within the M check nodes). The edge 467 is specifically shown as connecting from the bit node, $v_i$ 465, to the check node, $c_j$ 466. This number of $d_v$ edges (shown as $d_v$ 463) may be referred to as the degree of a variable node i. Analogously, a check node of the M check nodes 462 has $d_c(j)$ edges (shown as $d_c$ 464) connecting this node to one or more of the variable nodes (or bit nodes) 461. This number of edges, $d_c$ 464, may be referred to as the degree of the check node j.

An edge 467 between a variable node $v_i$ (or bit node $b_i$) 465 and check node $c_j$ 466 can be defined by e=(i, j). Alternatively, given an edge e=(i, j), the nodes of the edge may alternatively be denoted as by e=v(e),c(e)) (or e=(b(e), c(e))). The edges in the graph correspond to the set elements of H where a set element $h_{ij}$ indicates that an edge connects a bit (e.g., variable) node i with parity check node j.

Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$); these edges are referred to as bit edges, and the messages corresponding to these bit edges are referred to as bit edge messages.

Given a check node $c_j$ one may define the set of edges emitting from the node $c_j$ by $E_c(j)=\{e|c(e)=j\}$; these edges are referred to as check edges, and the messages corresponding to these check edges are referred to as check edge messages. Continuing on, the derivative result will be $|E_v(i)|=d_v$ (or $|E_b(i)|=d_b$) and $|E_c(j)|=d_c$.

Generally speaking, any such codes (e.g., LDPC codes) that can be represented by a bipartite graph may be characterized as a graph code. It is also noted that an irregular LDPC code may also be described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not be equal to $|E_v(i_2)|$. This relationship may also hold true for more than one (e.g., two) check nodes.

Note that terminology such as that of "bit node" and "bit edge message", or equivalents thereof, may be used in the art of LDPC decoding. With respect to LDPC decoding, note that "bit node" and "bit edge message" are alternatively referred to as "variable node" and "variable edge message", respectively. Note that LDPC decoding operates to make one or more estimates of the bit values (or variable values) encoded within an LDPC coded signal.

FIG. 4B illustrates an example 402 of decoding of an LDPC coded signal. Within a communication device (e.g., communication device 110), a signal received from a communication channel undergoes appropriate demodulation (e.g., processing within an analog front end including digital sampling, digital to analog conversion, filtering, frequency conversion (up or down), gain adjustment and/or scaling, etc.) to generate a received bit sequence. Then, a metric generator 471 calculates log-likelihood ratios (LLRs) for each bit location within the received bit sequence. These LLRs correspond initially to the bit nodes 461 of the LDPC code and its corresponding LDPC bipartite graph that represents the LDPC matrix used to decode the signal.

In an example of LDPC decoding, during initialization, the LLRs are employed for the bit edge messages (e.g., extrinsic information) of the edges extending from the respective bit/variable nodes. Thereafter, one or more decoding cycles or iterations may be performed based on check node processing and bit node processing (iterative decoding 472). Check node processing or check node updating is performed using the original bit edge messages (e.g., the calculated LLRs) such as by a check node processor 474. A bit/variable node processor 473 then uses these updated check edge messages to perform bit node processing or bit node updating to update the variable node soft information for use in the next decoding iteration. The most recently updated variable bit/node soft information is then used to calculate the variable node edge messages (extrinsic information) for this next decoding iteration. The check node processor 474 performs check message updating (based on rows of the LDPC matrix) to generate updated check edge messages, and the bit/variable node processor 473 performs bit or variable edge message updating (based on columns of the LDPC matrix) as also described with reference to FIG. 4A.

When more than one decoding iteration is performed, these variable node edge messages are then used by the check node processor 474 for subsequent check node processing or check node updating to calculate updated check edge messages. Then, bit/variable node processor 473 uses the most recently updated check edge messages to perform bit node processing or bit node updating to update the variable node soft information once again. After a final decoding iteration, which may be determined based on some parameter (e.g., a predetermined number of decoding iterations or when all syndromes of the LDPC code equal zero, as determined by syndrome calculator 476), the last calculated variable node soft information may undergo hard limiting (e.g., in a slicer or hard limiter 475) to generate one or more estimates of one or more bits encoded within the LDPC coded signal.

Generally speaking, this approach for decoding of LDPC coded signals may be referred to as a message passing approach (or iterative message passing approach). Note that LDPC decoding may be performed in any of a variety of architectures including parallel decoding architectures, layer decoding architectures etc. Device 110 may be implemented to perform encoding and/or decoding of LDPC coded signal using any desired approach or architecture.

Note that the various functional blocks and components depicted in FIG. 1B may be implemented or performed by the processor 130 (and memory 140) of communication device 110 or alternatively, processor 130a. For example, the processor 130 can be implemented to perform such decoding operations and the memory 140 can be implemented to store and perform memory management for the various bit/variable and check edge messages, variable bit/node soft information, extrinsic information, etc. used in the decoding operations.

FIG. 4C illustrates an example 403 of an LDPC matrix that is partitioned into sub-matrices. This diagram shows the relationship between an overall LDPC matrix and the individual sub-matrices therein that can be all zero-valued sub-matrices and/or CSI (Cyclic Shifted Identity) sub-matrices, and the diagram shows the sub-matrix rows and sub-matrix columns of the LDPC matrix that correspond to the sub-matrix arrangement of the LDPC matrix. Note also that a generator matrix, corresponding to an LDPC matrix, may be employed to encode at least one information bit to generate a plurality of LDPC coded bits and/or an LDPC codeword (e.g., such as using back-substitution described below). A generator matrix, G, of an LDPC code has the following relationship with LDPC matrix, H: $GH^T=0$. An LDPC code may be defined or characterized by its LDPC matrix, H, and/or its generator matrix, G.

A processor of a communication device (e.g., processor 330 of communication device 110) may be configured to encode at least one information bit to generate the plurality of LDPC coded bits and/or an LDPC codeword. The processor then transmits the plurality of LDPC coded bits and/or the LDPC codeword, within an LDPC coded signal via a communication interface (e.g., communication interface 120 of communication device 110). The processor may be configured to generate the LDPC coded signal by appropriate modulation of the plurality of LDPC coded bits and/or the LDPC codeword (e.g., processing within an analog front end including digital to analog conversion, filtering, frequency conversion (up or down), gain adjustment, etc.).

A binary LDPC code may be fully described by its parity check matrix (i.e., its LDPC matrix). At the top of the diagram, the individual elements of an LDPC matrix, H, are shown:

$$H = \begin{bmatrix} h_{0,0} & h_{0,1} & \ldots & h_{0,n-1} \\ h_{1,0} & h_{1,1} & \ldots & h_{1,n-1} \\ \ldots & \ldots & \ldots & \ldots \\ h_{m-1,0} & h_{m-1,1} & \ldots & h_{m-1,n-1} \end{bmatrix}$$

where n is the number of bits in a codeword, m is the number of parity check equations of the LDPC code, and $h_{i,j}$ is either 0 or 1. An n-bit vector c (e.g., $c=(c_1, c_2, \ldots, c_N)$) is a codeword (i.e., of the LDPC code) if and only if $Hc^T=0$.

For such an LDPC code, the parity matrix H is also composed of a number of q-by-q (i.e., q×q) square sub-matrices as shown in the bottom portion of the diagram and also below:

$$H = \begin{bmatrix} S_{0,0} & S_{0,1} & \ldots & S_{0,N-1} \\ S_{1,0} & S_{1,1} & \ldots & S_{1,N-1} \\ \ldots & \ldots & \ldots & \ldots \\ S_{M-1,0} & S_{M-1,1} & \ldots & S_{M-1,N-1} \end{bmatrix}$$

where M=m/q, N=n/q, and each sub-matrix, $S_{I,J}$, thereof is a q-by-q sub-matrix that is either an all-zero-valued sub-matrix (i.e., in which all elements thereof are the value of zero "0", which is depicted by a blank or an empty sub-matrix or a sub-matrix with value of "−1" therein in the associated diagrams) or a CSI (Cyclic Shifted Identity) sub-matrix. A CSI sub-matrix S is characterized by a shift-value, $\lambda(S)$, (e.g., a right shift value) such that the components of S are defined as follows:

$$s_{i,j} = \begin{cases} 1 & \text{if } i + \lambda(S) = j(\bmod q) \\ 0 & \text{otherwise} \end{cases}$$

for any i and j, with $0 \le i < q$ and $0 \le j < q$. For example, the q-by-q identity matrix is itself a CSI matrix with a shift-value $\lambda(S)=0$ (i.e., a CSI sub-matrix with a cyclic shift of zero "0").

As can be seen, the LDPC matrix (as depicted in the lower portion of the diagram), includes various sub-matrix rows and sub-matrix columns. These sub-matrix rows and columns are based on the sub-matrix construction of the LDPC matrix (e.g., shown as sub-matrix rows 0 through M−1 and sub-matrix columns 0 through N−1). This disclosure presents various new designs of LDPC codes.

Note also the following with respect to such LDPC code matrix constructions. A given LDPC code may be a QC (quasi-cyclic)-LDPC code. The definition of such an (n, k) QC-LDPC code is provided as follows:

1. (n−k)-by-n parity check matrix H
2. H is expanded from a binary base matrix $H_b$ of size v-by-u
3. The base matrix $H_b$ is expanded by replacing each sub-matrix in the base matrix with a size z permutation matrix, and each a blank, 0, or "−1" negative with a size z zero matrix (e.g., with all zero-valued elements). The permutations used are circular right shifts as described above, and the set of permutation sub-matrices contains the size z identity matrix and circular right shifted versions of the identity matrix (i.e., CSI sub-matrices).

Because each permutation matrix is specified by a single circular right shift, the binary base matrix information and permutation replacement information can be combined into a single compact model matrix $H_{bm}$. The model matrix $H_{bm}$ is the same size as the binary base matrix $H_b$, with each binary entry (i,j) of the base matrix $H_b$ replaced to create the model matrix $H_{bm}$. Each 0 in $H_b$ is replaced by a blank or "−1" negative to denote a size z all-zero matrix, and each other sub-matrix in $H_b$ is replaced by a circular shift size $p(i,j) \geq 0$ (e.g., an entry of "−1" indicates an all-zero-valued sub-matrix, and any other entry such as 0, 1, 2, etc. indicates an identity sub-matrix (if entry is 0), a CSI sub-matrix based on a shift-value of 1 (if entry is 1), a CSI sub-matrix based on a shift-value of 2 (if entry is 2), etc. and so on for any desired cyclic shift-value). The model matrix $H_{bm}$ can then be directly expanded to the entire LDPC matrix, H.

Note that this binary base matrix $H_b$ to generate the parity check matrix, H, may be referred to as lifting. The lifting factor corresponds to the size of the square sub-matrices (e.g., lifting factor of z when each sub-matrix in the base matrix with a size z permutation matrix). Generally, note that a permutation matrix (or sub-matrix), circulant permutation sub-matrix (or sub-matrix), a circulant permutation matrix (or sub-matrix), etc. maybe used to identify such a square matrix (or sub-matrix) that is an identity matrix (or sub-matrix) or a CSI matrix (or sub-matrix) of any desired size.

Figure 5A:
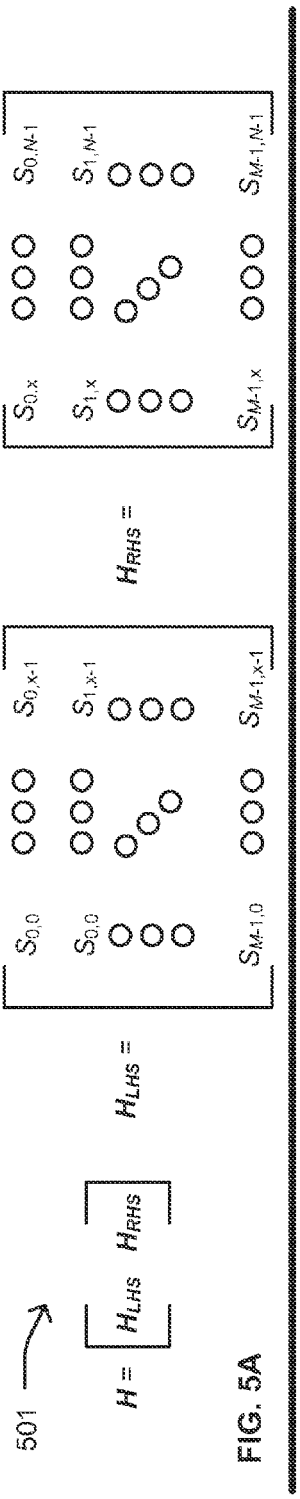
FIG. 5A is a diagram illustrating an example of an LDPC matrix partitioned into a left hand side matrix and a right hand side matrix.

FIG. 5A is a diagram illustrating an example 501 of an LDPC matrix partitioned into a left hand side matrix and a right hand side matrix. The parity matrix H of the bottom of FIG. 4C may be partitioned into a left hand side matrix, $H_{LHS}$, and a right hand side matrix, $H_{RHS}$. The partitioning will be in between two sub-matrix columns. This diagram shows the partitioning being between sub-matrix column x−1 and sub-matrix column x. Left hand side matrix, $H_{LHS}$, and right hand side matrix, $H_{RHS}$, include the same number of sub-matrix rows. In one implementation, the right hand side matrix, $H_{RHS}$, is a square matrix that includes a same number of sub-matrix rows and sub-matrix columns (e.g., the right hand side matrix, $H_{RHS}$, may generally be of any size such as z-by-z, where z is any desired number such as 2, 3, 4, 5, 6, 7, or even higher numbers etc.).

Figure 5B:
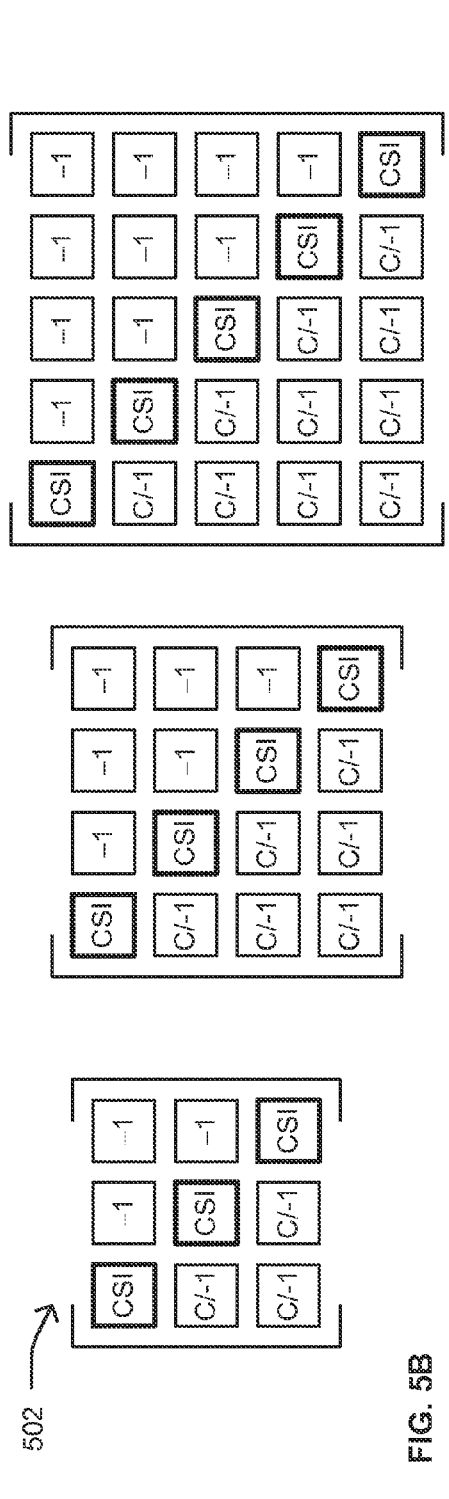
FIG. 5B is a diagram illustrating examples of right hand side matrices of LDPC matrices.

FIG. 5B is a diagram illustrating examples 502 of right hand side matrices of LDPC matrices. A right hand side matrix, $H_{RHS}$, having this form is lower triangular and includes all-zero-valued sub-matrices except for CSI (Cyclic Shifted Identity) sub-matrices located on a main diagonal of the right hand side matrix and certain one or more sub-matrices located below and to the left of the main diagonal of the right hand side matrix. The right hand side matrix is lower triangular and includes first all-zero-valued sub-matrices located above and to the right of the main diagonal of the right hand side matrix. First CSI (Cyclic Shifted Identity) sub-matrices are located on the main diagonal of the right hand side matrix, and second CSI sub-matrices and/or second all-zero-valued sub-matrices are located below and to the left of the main diagonal of the right hand side matrix. Those sub-matrices located below and to the left of the main diagonal of the right hand side matrix are depicted in the diagram as "C/−1" since each of them may be either a CSI sub-matrix or an all-zero-valued sub-matrix.

Note also that such CSI sub-matrices may be based on different CSI values. A CSI value of zero indicates an identity sub-matrix (e.g., with no cyclic shift performed therein). A CSI value of 1 indicates an identity sub-matrix that has undergone a cyclic shift by 1. Any desired CSI value may be employed up to the sub-matrix size, z, if considering sub-matrices of size z-by-z. Generally speaking, a CSI value of x indicates an identity sub-matrix that has undergone a cyclic shift by x.

While examples have been provided showing LDPC decoding, processor 130 and/or communication interface 120 (or processor 130a) of device 110-1 or 110-2 can also be configured to perform encoding of bit(s) to generate LDPC coded bit(s) and/or LDPC codeword(s). Such encoding maybe performed using back-substitution. An LDPC matrix may be partitioned into a left hand side matrix, $H_{LHS}$, and a right hand side matrix, $H_{RHS}$, such as shown in FIG. 5A. The right hand side matrix, $H_{RHS}$, can have the form of any of the right hand side matrices of FIG. 5B, and may be of any desired size such as 3-by-3, 4-by-4, 5-by-5, or generally of any size such as z-by-z, where z is any desired number such as 2, 3, 4, 5, 6, 7, etc.

Considering a right hand side matrix, $H_{RHS}$, having the form of those in FIG. 5B, a CSI sub-matrix may be a respective identity matrix that has either not been cyclic shifted (and remains an identity matrix) or a respective identity matrix that has been cyclic shifted by some amount as described above. For sub-matrices of size, L-by-L, input (information) bits, $c_{in}$ (k bits=L(n−m) bits), may be represented as follows: $c_{in} = (c_0, c_1, \ldots, c_{k-1})$.

The processor 130 and/or communication interface 120 (or processor 130a) then encodes the input (information) bits and computes L·m parity bits, $c_{par}$ (e.g., LDPC coded bits) as follows: $c_{par} = (c_k, c_{k+1}, \ldots, c_{Ln-1})$ The processor 130 and/or communication interface 120 (or processor 130a) then outputs the following:

$$c_P^T = \begin{pmatrix} C_0 \\ C_1 \\ C_2 \\ C_3 \\ C_4 \end{pmatrix}, \text{ where}$$

$$C_i = (c_{L(n-m+i)}, c_{L(n-m+i)+1}, \ldots, c_{L(n-m+i)+L-1})^T.$$

For a right hand side matrix, $H_{RHS}$, in the form of those in FIG. 5B being of size 5-by-5 (e.g., where i varies from 0 to 4 in order of 0, 1, 2, 3, 4).

The encoding procedure may be described as follows:
Input: $c_1 = (c_0, c_1, \ldots, c_{k-1})$
Step 1: compute $V_i = H_{l,i} c_I^T$, such that $i=0, \ldots, 4$.
Step 2: back-substitution $C_0 = V_0(L - u_{0,0})$ $C_1 = V_1(L - u_{1,1}) + C_0((L - u_{1,1} + u_{1,0}) \bmod L)$ $$C_2 = V_2(L-u_{2,2}) + C_1((L-u_{2,2}+u_{2,1}) \bmod L)$$

$$C_3 = V_3(L-u_{3,3}) + C_2((L-u_{3,3}+u_{3,2}) \bmod L)$$

$$C_4 = V_4(L-u_{4,4}) + C_3((L-u_{4,4}+u_{4,3}) \bmod L)$$

Output:

$$c_P^T = \begin{pmatrix} C_0 \\ C_1 \\ C_2 \\ C_3 \\ C_4 \end{pmatrix}$$

Note that this approach shows just one possible example by which encoding based on an LDPC code may be performed. Generally, the decoding operations described herein may be performed on an LDPC coded signal that is generated using any LDPC encoding approach.

This disclosure presents examples of a 2-bit symbol non-binary low density parity check (NB-LDPC) code. This disclosure also presents the first application of non-binary low density parity check (NB-LDPC) code in communication system applications. This disclosure presents an optimized or heuristic optimized method to develop such code. Until now, LDPC codes used in wired and/or wireless communication applications have been binary. However, for small to medium sized forward error correction (FEC) or error checking and correction (ECC) codes, binary LDPC codes can have limited performance. One way to improve the FEC performance is to apply NB-LDPC codes such as described herein. This novel type of LDPC code provides an FEC coding gain compared to prior art FEC or ECC codes currently used in communications. This novel type of LDPC code can be applied to any type of communication systems.

Figure 5C:
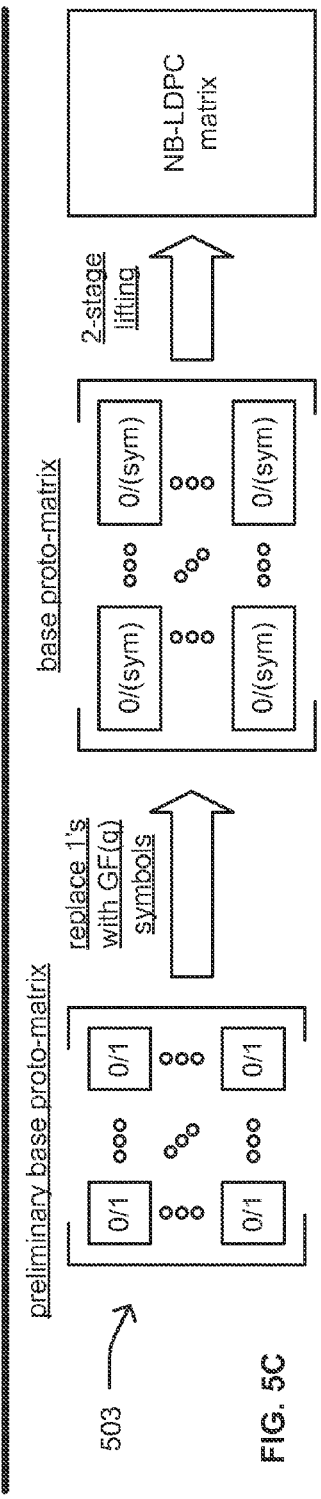
FIG. 5C is a diagram illustrating an example of generation of a non-binary low density parity check (NB-LDPC) matrix.

FIG. 5C is a diagram illustrating an example 503 of generation of a non-binary low density parity check (NB-LDPC) matrix. A preliminary base proto-matrix includes elements that are 1s and 0s (e.g., selected from a Galois field that includes 0, 1). Then, the non-zero-valued elements within the preliminary base proto-matrix (e.g., the 1s) are replaced by symbols from another Galois field to generate a base proto-matrix. In one example, the 1s of the preliminary base proto-matrix are replaced with elements from another finite Galois field (e.g., a Galois field that include 4 elements such as 0, α, β, and γ) to generate the base proto-matrix. In another example, the 1s of the preliminary base proto-matrix are replaced with elements from another finite Galois field (e.g., a Galois field that include 4 elements such as 0, 1, 2, and 3) to generate the base proto-matrix. In another example, the 1s of the preliminary base proto-matrix are replaced with elements from another finite Galois field (e.g., a Galois field that include 8 elements such as 0, 1, 2, 3, 4, 5, 6, 7, and 8) to generate the base proto-matrix. In other examples, elements may be selected from a Galois field of any desired size with symbols therein of any corresponding desired number of bits (e.g., generally shown as "sym" in the diagram).

Then, the base proto-matrix undergoes a 2-stage lifting process to generate a NB-LDPC matrix. Such operations to generate such a NB-LDPC matrix in accordance with the operations of this diagram may be performed by one or more components within any communication device such as described herein. Some examples of such a 2-stage lifting process are described below such as with respect to FIG. 6B, FIG. 6C, FIG. 7A, FIG. 7B, and FIG. 7C.

FIG. 6A is a diagram illustrating an example 601 of a proto-graph and a corresponding matrix having multiple edges between at least one variable node and at least one check node. A proto-graph having a corresponding parity check matrix, $H_p$, as shown can have more than one edge connected between variable nodes and check nodes. In some examples, each edge of a subset of edges that corresponds to a given sub-matrix that is based on a non-zero-valued symbol has a common weight. For example, 2 or more edges that correspond to a given sub-matrix of an overall NB-LDPC matrix may all have the same weight. In general, comparing the LDPC code bipartite graph of FIG. 4A to a NB-LDPC code bipartite graph, the LDPC code bipartite graph generally has no more than 1 edge connected between a given variable node and a check node while the NB-LDPC code bipartite graph can include more than 1 edge connected between a given variable node and a check node (e.g., 2 edges such as in this diagram, or generally any number of edges connected between a given variable node and a check node based on the non-binary symbols included within the base proto-matrix corresponding to the NB-LDPC matrix).

This diagram shows a 2×3 matrix that can be represented by a proto-graph such that the top variable node is connected to the top check node with 2 edges and is connected to the bottom check node with 2 edge. The middle variable node is connected to the top check node with 2 edges and is not connected to the bottom check, and the bottom variable node is not connected to the top check node and is connected to the bottom check with 2 edges. Note that such a 2×3 matrix may be sub-portion of a NB-LDPC matrix. This diagram provides an illustration showing an example how multiple edges that may be connected between a given variable node and a given check node. These principles can be extended to any shaped or sized matrix as desired in various applications.

FIG. 6B is a diagram illustrating an example 602 of generation of a base proto-matrix. A preliminary base proto-matrix includes elements that are 1s and 0s (e.g., selected from a Galois field that includes 0, 1). Then, the non-zero-valued elements within the preliminary base proto-matrix (e.g., the 1s) are replaced by symbols from another Galois field to generate a base proto-matrix. In one example, the is of the preliminary base proto-matrix are replaced with elements from another finite Galois field (e.g., a Galois field that include 4 elements such as 0, α, β, and γ) to generate the base proto-matrix. Note that any of a number of different approaches may be used to replace the non-zero-valued elements within the preliminary base proto-matrix with elements (or symbols) from another finite Galois field to generate the base proto-matrix. Examples may include user selection, a brute force approach that considers all possible variations and selects one that provides a desired (e.g., relatively best) performance, a Greedy Search approach, and/or any other desired approach to select which elements from other finite Galois field are used to replace the specific locations of 1s within the preliminary base proto-matrix.

FIG. 6C is a diagram illustrating another example 603 of generation of a NB-LDPC matrix. A preliminary base proto-matrix includes elements that are 1s and 0s (e.g., selected from a Galois field that includes 0, 1). Then, the non-zero-valued elements within the preliminary base proto-matrix (e.g., the 1s) are replaced by symbols from another Galois field to generate a base proto-matrix. In one example, the 1s of the preliminary base proto-matrix are replaced with elements from another finite Galois field (e.g., a Galois field that include 4 elements such as 0, 1, 2, and 3) to generate the base proto-matrix. In this examples, two of the 1s in the preliminary base proto-matrix are replace with the element 1, one of the is in the preliminary base proto-matrix are replace with the element 2, and one of the 1s in the preliminary base proto-matrix are replace with the element 3. The zero-valued elements within the preliminary base proto-matrix (e.g., the 0s) remain as zero-valued elements (e.g., 0s) in the base proto-matrix.

The base proto-matrix undergoes a 2-stage lifting process to generate a NB-LDPC matrix. The base proto-matrix undergoes a $1^{st}$-stage lifting process using a first lifting factor to generate sub-matrices. In this process, a zero-valued 2-bit symbol (e.g., 0 or 00 in binary) within the base proto-matrix represents an all-zero-valued sub-matrix within the plurality of sub-matrices. A first zero-valued 2-bit symbol (e.g., 1 or 01 in binary) within the base proto-matrix represents first sub-matrix that is a circulant permutation sub-matrix (e.g., a CSI sub-matrix). A second zero-valued 2-bit symbol (e.g., 2 or 10 in binary) within the base proto-matrix represents a second sub-matrix that is a sum of two circulant permutation sub-matrices (e.g., a sum of 2 circulant permutation sub-matrices, e.g., a sum of 2 CSI sub-matrices). A third zero-valued 2-bit symbol (e.g., 3 or 11 in binary) within the base proto-matrix represents a third sub-matrix that is another sum of three circulant permutation sub-matrices (e.g., a sub-matrix including all elements of is in the context of using symbols from a Galois field that include 4 elements such as 0, 1, 2, and 3). This a $1^{st}$-stage lifting process, using symbols from a Galois field that include 4 elements such as 0, 1, 2, and 3, corresponds to a lifting factor of 3. In general, using larger sized Galois fields that include more elements will result in higher lifting factors.

Then, the sub-matrices undergo a $2^{nd}$-stage lifting process using a second lifting factor to generate the NB-LDPC matrix.

Figures 7A, 7B:
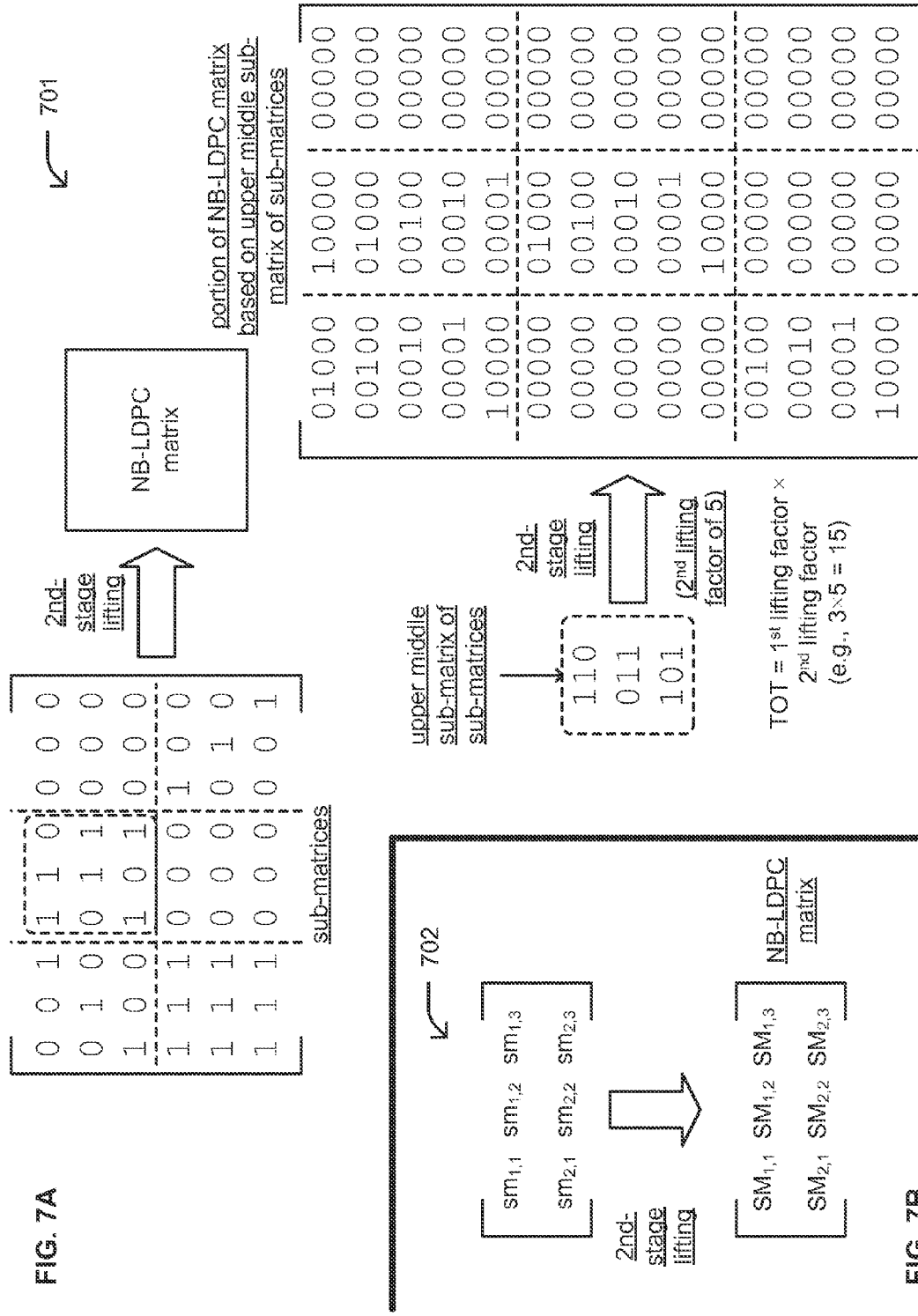
FIG. 7A is a diagram illustrating an example of generation of a NB-LDPC matrix from sub-matrices.
FIG. 7B is a diagram illustrating another example of generation of a NB-LDPC matrix from sub-matrices.

FIG. 7A is a diagram illustrating an example 701 of generation of a NB-LDPC matrix from sub-matrices. The sub-matrices undergo a $2^{nd}$-stage lifting process, and an example based on the upper middle sub-matrix of the base proto-matrix shown in this diagram. The lifting process operates to generate a respective sub-matrix, based on a $2^{nd}$-lifting factor. This diagram shows a $2^{nd}$-lifting factor of 5, so that each 1 within the upper middle sub-matrix of the base proto-matrix represents a respective 5×5 circulant permutation sub-matrix (e.g., a respective 5×5 identity sub-matrix or a respective 5×5 CSI sub-matrix). Note that a 0 within the upper middle sub-matrix of the base proto-matrix represents a respective 5×5 all-zero-valued sub-matrix (e.g., a respective 5×5 sub-matrix with all elements thereof being 0's/zeroes). The selection of what cyclic shift (if any) is used when generating the NB-LDPC matrix based on the non-zero-valued elements of the upper middle sub-matrix of the base proto-matrix may be made using any desired means (e.g., by user selection, by using a brute force approach that considers all possible variations and selects one that provides a desired (e.g., relatively best) performance, a Greedy Search approach, and/or any other desired approach to select what cyclic shift (if any) is used to generate the NB-LDPC matrix. Note that this diagram shows a portion of the overall NB-LDPC matrix.

Note that some examples may operate such that the $1^{st}$-lifting factor is same as the $2^{nd}$-lifting factor, while other examples may operate such that the $1^{st}$-lifting factor is different than the $2^{nd}$-lifting factor.

FIG. 7B is a diagram illustrating another example 702 of generation of a NB-LDPC matrix from sub-matrices. While FIG. 7A shows a portion of the overall NB-LDPC matrix that is generated by particular sub-matrix of the sub-matrices, note that, in general, a corresponding process is performed for every one of the sub-matrices to generate the NB-LDPC matrix. For example, consider sub-matrices shown as top row: $sm_{1,1}$, $sm_{1,2}$, $sm_{1,3}$ and bottom row: $sm_{2,1}$, $sm_{2,2}$, $sm_{2,3}$, then those sub-matrices undergo a $2^{nd}$-stage lifting process (e.g., based on a $2^{nd}$-lifting factor) to generate the respective portions of the NB-LDPC matrix shown as top row: $SM_{1,1}$, $SM_{1,2}$, $SM_{1,3}$ and bottom row: $SM_{2,1}$, $SM_{2,2}$, $SM_{2,3}$ such that each of the $SM_{n,m}$ is a respective z×z (e.g., a respective z×z identity sub-matrix or a respective z×z CSI sub-matrix, where z is a positive integer). For example, the sub-matrix $sm_{1,1}$ is used to generate the portion $SM_{1,1}$ of the NB-LDPC matrix, and the sub-matrix $sm_{1,2}$ is used to generate the portion $SM_{1,2}$ of the NB-LDPC matrix, and so on in accordance with the $2^{nd}$-stage lifting process.

Note that the particular sizes and shapes of many of the examples of matrices, sub-matrices, base proto-matrices, LDPC matrices, NB-LDPC matrices may be different that the examples shown herein and used for illustration. In general, the $1^{st}$-lifting factor and the $2^{nd}$-lifting factor may be of any desired size and shape.

Figure 8B:
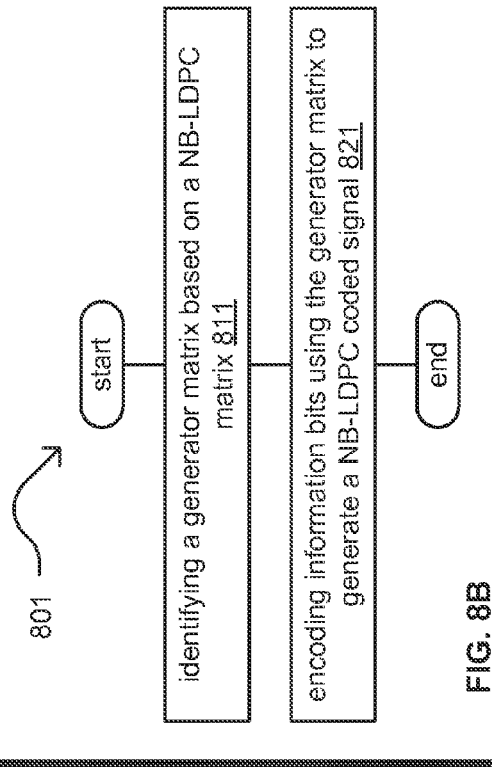
FIG. 8B is a diagram illustrating another embodiment of a method for execution by one or more communication devices.
Figure 8A:
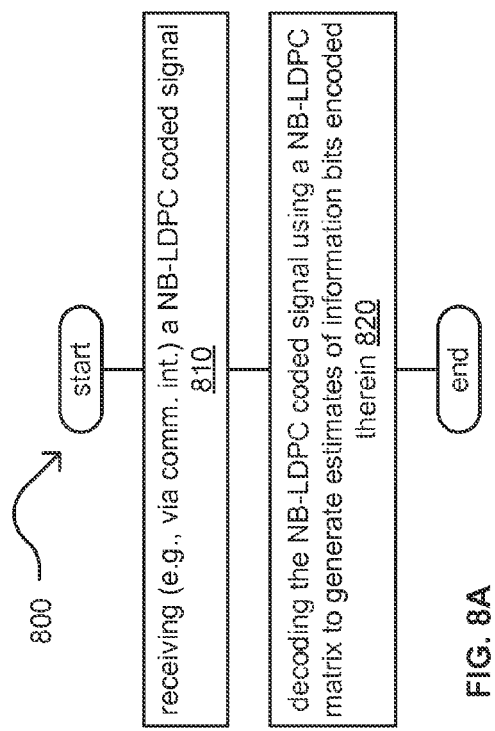
FIG. 8A is a diagram illustrating an embodiment of a method for execution by one or more communication devices.

FIG. 8A is a diagram illustrating an embodiment of a method 800 for execution by one or more communication devices. The method 800 begins by receiving (e.g., via a communication interface of a communication device), a NB-LDPC coded signal (block 810). The method 800 continues by decoding the NB-LDPC coded signal using a NB-LDPC matrix to generate estimates of information bits encoded therein (block 820).

FIG. 8B is a diagram illustrating another embodiment of a method 801 for execution by one or more communication devices. The method 801 begins by identifying a generator matrix that is based on a NB-LDPC matrix (block 811). As described herein, a corresponding generator matrix may be identified based on a LDPC matrix such as a NB-LDPC matrix. The method 801 continues by encoding information bits using the generator matrix to generate a NB-LDPC coded signal (block 821). In some examples, the method 801 may operate by transmitting the NB-LDPC coded signal (e.g., via a communication interface of a communication device).

Note that the NB-LDPC matrix of FIG. 8A and FIG. 8B may be of any desired size, shape form, etc. as constructed in accordance with any of the examples, embodiments, variants, and/or their equivalents herein.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to," "operably coupled to," "coupled to," and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to," "operable to," "coupled to," or "operably coupled to" indicates that an item includes one or more of power connections, input(s), output(s), etc., to perform, when activated, one or more its corresponding functions and may further include inferred coupling to one or more other items. As may still further be used herein, the term "associated with," includes direct and/or indirect coupling of separate items and/or one item being embedded within another item.

As may be used herein, the term "compares favorably" or equivalent, indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module," "processing circuit," "processor," and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments of an invention have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The one or more embodiments are used herein to illustrate one or more aspects, one or more features, one or more concepts, and/or one or more examples of the invention. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module includes a processing module, a processor, a functional block, hardware, and/or memory that stores operational instructions for performing one or more functions as may be described herein. Note that, if the module is implemented via hardware, the hardware may operate independently and/or in conjunction with software and/or firmware. As also used herein, a module may contain one or more sub-modules, each of which may be one or more modules.

While particular combinations of various functions and features of the one or more embodiments have been expressly described herein, other combinations of these features and functions are likewise possible. The present disclosure of an invention is not limited by the particular examples disclosed herein and expressly incorporates these other combinations.

What is claimed is:
1. A communication device comprising:
a communication interface; and
a processor coupled to the communication interface and configured to:
receive, via the communication interface and from another communication device via a communication channel, a non-binary low density parity check (NB-LDPC) coded signal that includes information bits encoded therein to be communicated from the another communication device to the communication device via the communication channel to support communications between the communication device and the another communication device; and decode the NB-LDPC coded signal using a NB-LDPC matrix to generate estimates of the information bits encoded therein by the another communication device to support the communications between the communication device and the another communication device, wherein the NB-LDPC matrix is characterized by a base proto-matrix having a plurality of elements that represent a plurality of sub-matrices, wherein the plurality of elements are selected from a finite Galois field that includes 2-bit symbols, wherein a plurality of edges specify connectivity between a plurality of check nodes and a plurality of variable nodes based on the NB-LDPC matrix, and wherein each edge of a subset of edges of the plurality of edges corresponding to a sub-matrix of the plurality of sub-matrices that is based on a non-zero-valued 2-bit symbol has a common weight.

2. The communication device of claim 1, wherein:
a zero-valued 2-bit symbol within the base proto-matrix represents an all-zero-valued sub-matrix within the plurality of sub-matrices;
a first zero-valued 2-bit symbol within the base proto-matrix represents first sub-matrix of the plurality of sub-matrices that is a circulant permutation sub-matrix;
a second zero-valued 2-bit symbol within the base proto-matrix represents a second sub-matrix of the plurality of sub-matrices that is a first sum of two circulant permutation sub-matrices; and
a third zero-valued 2-bit symbol within the base proto-matrix represents a third sub-matrix of the plurality of sub-matrices that is a second sum of three circulant permutation sub-matrices.

3. The communication device of claim 1, wherein:
each edge of a first subset of edges of the plurality of edges that corresponds to a first sub-matrix of the plurality of sub-matrices that is based on a first non-zero-valued 2-bit symbol has a first common weight; and
each edge of a second subset of edges of the plurality of edges that corresponds to a second sub-matrix of the plurality of sub-matrices that is based on a second non-zero-valued 2-bit symbol has a second common weight that is different than the first common weight.

4. The communication device of claim 1, wherein the processor is further configured to:
perform a first stage lifting of the base proto-matrix to generate the plurality of sub-matrices; and
perform a second stage lifting of the plurality of sub-matrices to generate NB-LDPC matrix.

5. The communication device of claim 1, wherein the processor is further configured to:
perform a first stage lifting of the base proto-matrix using a first lifting factor to generate the plurality of sub-matrices; and
perform a second stage lifting of the plurality of sub-matrices using a second lifting factor that is different than the first lifting factor to generate the NB-LDPC matrix, wherein a total lifting factor from the base proto-matrix to the NB-LDPC matrix is a product of the first lifting factor and the second lifting factor.

6. The communication device of claim 1, wherein the processor is further configured to:
generate a preliminary base proto-matrix having another plurality of elements selected from another finite Galois field that includes 1-bit symbols; and
replace non-zero-valued elements of the another plurality of elements within the preliminary base proto-matrix with the plurality of elements that are selected from the finite Galois field that includes 2-bit symbols to generate the base proto-matrix.

7. The communication device of claim 1, wherein the processor is further configured to:
encode other information bits using a generator matrix to generate another NB-LDPC coded signal, wherein the generator matrix corresponds to the NB-LDPC matrix.

8. The communication device of claim 1, wherein the processor is further configured to:
support the communications within at least one of a satellite communication system, a wireless communication system, a wired communication system, a fiber-optic communication system, or a mobile communication system.

9. A communication device comprising:
a communication interface; and
a processor coupled to the communication interface and configured to:
receive, via the communication interface and from another communication device via a communication channel, a first non-binary low density parity check (NB-LDPC) coded signal from another communication device, wherein the first NB-LDPC coded signal includes information bits encoded therein to be communicated from the another communication device to the communication device via the communication channel to support communications between the communication device and the another communication device;
decode the first NB-LDPC coded signal using a NB-LDPC matrix to generate estimates of first information bits encoded therein by the another communication device to support the communications between the communication device and the another communication device, wherein the NB-LDPC matrix is characterized by a base proto-matrix having a plurality of elements that represent a plurality of sub-matrices, wherein the plurality of elements are selected from a finite Galois field that includes 2-bit symbols, wherein a plurality of edges specify connectivity between a plurality of check nodes and a plurality of variable nodes based on the NB-LDPC matrix, wherein each edge of a first subset of edges of the plurality of edges that corresponds to a first sub-matrix of the plurality of sub-matrices that is based on a first non-zero-valued 2-bit symbol has a first common weight, and wherein each edge of a second subset of edges of the plurality of edges that corresponds to a second sub-matrix of the plurality of sub-matrices that is based on a second non-zero-valued 2-bit symbol has a second common weight that is different than the first common weight; and
encode second information bits using a generator matrix to generate a second NB-LDPC coded signal, wherein the generator matrix corresponds to the NB-LDPC matrix; and
transmit the second NB-LDPC coded signal to at least one of the another communication device or at least one other communication device, wherein the second NB-LDPC coded signal includes other information bits encoded therein to be communicated via the communication channel to the another communication device from the communication device to support the communications between the communication device and the another communication device.

10. The communication device of claim 9, wherein:
a zero-valued 2-bit symbol within the base proto-matrix represents an all-zero-valued sub-matrix within the plurality of sub-matrices;
a first zero-valued 2-bit symbol within the base proto-matrix represents the first sub-matrix of the plurality of sub-matrices that is a circulant permutation sub-matrix;
a second zero-valued 2-bit symbol within the base proto-matrix represents the second sub-matrix of the plurality of sub-matrices that is a first sum of two circulant permutation sub-matrices; and
a third zero-valued 2-bit symbol within the base proto-matrix represents a third sub-matrix of the plurality of sub-matrices that is a second sum of three circulant permutation sub-matrices.

11. The communication device of claim 9, wherein the processor is further configured to:
perform a first stage lifting of the base proto-matrix using a first lifting factor to generate the plurality of sub-matrices; and
perform a second stage lifting of the plurality of sub-matrices using a second lifting factor that is different than the first lifting factor to generate the NB-LDPC matrix, wherein a total lifting factor from the base proto-matrix to the NB-LDPC matrix is a product of the first lifting factor and the second lifting factor.

12. The communication device of claim 9, wherein the processor is further configured to:
generate a preliminary base proto-matrix having another plurality of elements selected from another finite Galois field that includes 1-bit symbols; and
replace non-zero-valued elements of the another plurality of elements within the preliminary base proto-matrix with the plurality of elements that are selected from the finite Galois field that includes 2-bit symbols to generate the base proto-matrix.

13. The communication device of claim 9, wherein the processor is further configured to:
support the communications within at least one of a satellite communication system, a wireless communication system, a wired communication system, a fiber-optic communication system, or a mobile communication system.

14. A method for execution by a communication device, the method comprising:
receive, via a communication interface of the communication device and from another communication device via a communication channel, a non-binary low density parity check (NB-LDPC) coded signal that includes information bits encoded therein to be communicated from the another communication device to the communication device via the communication channel to support communications between the communication device and the another communication device; and
decoding the NB-LDPC coded signal using a NB-LDPC matrix to generate estimates of the information bits encoded therein by the another communication device to support the communications between the communication device and the another communication device, wherein the NB-LDPC matrix is characterized by a base proto-matrix having a plurality of elements that represent a plurality of sub-matrices, wherein the plurality of elements are selected from a finite Galois field that includes 2-bit symbols, wherein a plurality of edges specify connectivity between a plurality of check nodes and a plurality of variable nodes based on the NB-LDPC matrix, and wherein each edge of a subset of edges of the plurality of edges corresponding to a sub-matrix of the plurality of sub-matrices that is based on a non-zero-valued 2-bit symbol has a common weight.

15. The method of claim 14, wherein:
a zero-valued 2-bit symbol within the base proto-matrix represents an all-zero-valued sub-matrix within the plurality of sub-matrices;
a first zero-valued 2-bit symbol within the base proto-matrix represents first sub-matrix of the plurality of sub-matrices that is a circulant permutation sub-matrix;
a second zero-valued 2-bit symbol within the base proto-matrix represents a second sub-matrix of the plurality of sub-matrices that is a first sum of two circulant permutation sub-matrices; and
a third zero-valued 2-bit symbol within the base proto-matrix represents a third sub-matrix of the plurality of sub-matrices that is a second sum of three circulant permutation sub-matrices.

16. The method of claim 14, wherein:
each edge of a first subset of edges of the plurality of edges that corresponds to a first sub-matrix of the plurality of sub-matrices that is based on a first non-zero-valued 2-bit symbol has a first common weight; and
each edge of a second subset of edges of the plurality of edges that corresponds to a second sub-matrix of the plurality of sub-matrices that is based on a second non-zero-valued 2-bit symbol has a second common weight that is different than the first common weight.

17. The method of claim 14 further comprising:
performing a first stage lifting of the base proto-matrix using a first lifting factor to generate the plurality of sub-matrices; and
performing a second stage lifting of the plurality of sub-matrices using a second lifting factor that is different than the first lifting factor to generate the NB-LDPC matrix, wherein a total lifting factor from the base proto-matrix to the NB-LDPC matrix is a product of the first lifting factor and the second lifting factor.

18. The method of claim 14 further comprising:
generating a preliminary base proto-matrix having another plurality of elements selected from another finite Galois field that includes 1-bit symbols; and
replacing non-zero-valued elements of the another plurality of elements within the preliminary base proto-matrix with the plurality of elements that are selected from the finite Galois field that includes 2-bit symbols to generate the base proto-matrix.

19. The method of claim 14 further comprising:
encoding other information bits using a generator matrix to generate another NB-LDPC coded signal, wherein the generator matrix corresponds to the NB-LDPC matrix.

20. The method of claim 14 further comprising:
operating the communication interface of the communication device to support the communications within at least one of a satellite communication system, a wireless communication system, a wired communication system, a fiber-optic communication system, or a mobile communication system.

* * * * *